US008298728B2

(12) United States Patent
Piao et al.

(10) Patent No.: US 8,298,728 B2
(45) Date of Patent: Oct. 30, 2012

(54) MASK PLATE AND MANUFACTURING METHOD THEREOF

(75) Inventors: Yunfeng Piao, Beijing (CN); Chunbae Park, Beijing (CN); Wei Qin, Beijing (CN); Wei Wang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 471 days.

(21) Appl. No.: 12/538,927

(22) Filed: Aug. 11, 2009

(65) Prior Publication Data

US 2010/0040960 A1 Feb. 18, 2010

(30) Foreign Application Priority Data

Aug. 13, 2008 (CN) .......................... 2008 1 0118177

(51) Int. Cl.
*G03F 1/00* (2006.01)

(52) U.S. Cl. .......................................................... 430/5
(58) Field of Classification Search ........................ 430/5
See application file for complete search history.

(56) References Cited

U.S. PATENT DOCUMENTS

| 5,242,770 | A | * | 9/1993 | Chen et al. | 430/5 |
| 6,210,841 | B1 | * | 4/2001 | Lin et al. | 430/5 |
| 6,835,504 | B2 | * | 12/2004 | Chang | 430/5 |
| 6,861,182 | B2 | * | 3/2005 | Chang | 430/5 |
| 2008/0182179 | A1 | * | 7/2008 | Tsai | 430/5 |
| 2008/0241708 | A1 | * | 10/2008 | Lin et al. | 430/5 |

FOREIGN PATENT DOCUMENTS

| JP | 2005-156768 A | 6/2005 |
| JP | 2007-178649 A | 7/2007 |
| KR | 2008-0025545 A | 3/2008 |

* cited by examiner

*Primary Examiner* — Jonathan Jelsma
(74) *Attorney, Agent, or Firm* — Ladas & Parry LLP

(57) ABSTRACT

The present invention discloses a mask plate and manufacturing method thereof. The mask plate comprises a substrate formed with a transparent region, a non-transparent region and a semi-transparent region. The semi-transparent region comprises a semi-transparent film, and a middle portion of the semi-transparent region is formed so that the intensity of the light transmitted therethrough is reduced in a larger extent than that in which the intensity of the light transmitted through the portion other than the middle portion in the semi-transparent region is reduced, whereby the light transmitted through the semi-transparent region is uniform.

24 Claims, 11 Drawing Sheets

MASK PLATE AND MANUFACTURING METHOD THEREOF

BACKGROUND OF THE INVENTION

Embodiments of the present invention relate to a mask plate and a manufacturing method thereof.

Among plane panel displays, thin film transistor liquid crystal displays (TFT-LCDs), with the characteristics of low power consumption, low manufacturing cost, free of irradiation and etc, play an important role. As an important component in a TFT-LCD, each of TFTs comprise a gate electrode, a gate insulating layer, a semiconductor layer, a doped semiconductor layer, a source electrode, a drain electrode, and a passivation layer, and are connected with a respective pixel electrode. An early process for manufacturing a TFT comprises a Five-Mask technology. In the recent years, with the development of the TFT manufacturing technology, more and more broadly applied is a Four-Mask process, in which the gate insulating layer, the semiconductor layer, the doped semiconductor layer, the source electrode and the drain electrode are patterned in same one patterning process. Generally, the Four-Mask technology makes use of a gray tone mask or a half tone mask. During forming the gate insulating layer, the semiconductor layer, the doped semiconductor layer, the source/drain electrodes in the Four-Mask process, the gate insulating layer, the semiconductor layer, the doped semiconductor layer, and the source/drain electrode layer are deposited subsequently on a substrate, and then a photoresist layer is applied and the photoresist layer is exposed with a gray tone mask or a half tone mask so as to form a photoresist pattern with a unexposed region, a partially exposed region, and a fully expose region. The region excluding the source electrode, the drain electrode, the data line and the TFT channel are fully exposed, and the source/drain metal layer is etched for example by a wetting method in this fully exposed area. The TFT channel region is partially exposed, and the partially exposed region is subject to an ashing treatment by a dry method so as to remove the photoresist in this region, and the source/drain metal layer and the doped semiconductor layer between the source/drain electrodes are etched so as to form the TFT channel.

FIG. 21 is a schematic view showing the exposing of the TFT channel region by using a conventional gray tone mask. As shown in FIG. 21, two slits are formed in the semi-transparent region of the gray tone mask, the intensity of the transmitted light decreases due to the interference of the light caused by the two slits, so that the photoresist layer on the object substrate 6 is partially exposed, so the partial exposure effect is obtained. Since such two-slit interference is used, the exposure extent at the positions corresponding to the slits is relatively large and the exposure extent at the position between the two slits (i.e., slit bars) is relatively small, and therefore, unevenness appears on the exposed photoresist layer in the channel region and ripple distribution is formed, which greatly increases the difficulties in the subsequent etching. During the etching process, if the portion of the etched layer corresponding to the portion with relative large exposure extent of the photoresist pattern is ensured to be etched, then the portion of the etched layer corresponding to the portion with relative small exposure extent of the photoresist pattern is not be fully etched, bringing about a defect called as gray tone bridge (GT bridge). If the portion of the etched layer corresponding to the portion with relative small exposure extent of the photoresist pattern is ensured to be etched, then the portion of the etched layer corresponding to the portion with relative large exposure extent of the photoresist pattern is overly etched, bringing about a defect called as channel open. Under the condition of the current grey tone mask technology, the GT bridge and the channel open are hard to be avoided at the same time.

FIG. 22 is a schematic view showing a schematic view showing the exposing of the TFT channel region by using a conventional half tone exposure technology. As shown in FIG. 22, in the half tone mask, the semi-transparent region on the substrate wilt be formed with a semi-transparent film 4 (e.g., $Cr_2O_3$) with uniform thickness. Since the semi-transparent film is very thin, the light will partially transmit through the semi-transparent film 4 during the exposure, so that the photoresist layer on the object substrate 6 is partially exposed and the partial exposure effect is obtained. The thickness of the semi-transparent film is uniform and the light in the middle portion of the semi-transparent film is transmitted therethrough vertically, so that the intensity of the light here is large, but the intensity of the light at the both two edges is small. Therefore, the exposed photoresist after exposure with the mask is formed into an ellipse shape as shown in FIG. 21. The exposed photoresist layer in the channel region will be formed with a relatively small tilt angle 8, so that the length of the channel formed in the subsequent etching process with a dry method is increased, which adversely influences and degrades the charging characteristics of the TFT channel.

SUMMARY OF THE INVENTION

An embodiment of the invention discloses a mask plate. The mask plate comprises a substrate formed with a transparent region, a non-transparent region and a semi-transparent region. The semi-transparent region comprises a semi-transparent film, and a middle portion of the semi-transparent region is formed so that the intensity of the light transmitted therethrough is reduced in a larger extent than that in which the intensity of the light transmitted through the portion other than the middle portion in the semi-transparent region is reduced, and therefore the light transmitted through the semi-transparent region is uniform.

Another embodiment of the invention discloses a method for manufacturing a mask plate, and the method comprises forming a transparent region, a non-transparent region, and a semi-transparent region on a substrate. The non-transparent region is formed by pattering a metal layer formed on the substrate; the semi-transparent region is formed by patterning a semi-transparent film formed on the substrate, and a middle portion of the semi-transparent region is formed so that the intensity of the light transmitted therethrough is reduced in a larger extent than that in which the intensity of the light transmitted through the portion other than the middle portion in the semi-transparent region is reduced. Therefore, the light transmitted through the semi-transparent region is uniform.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 1:
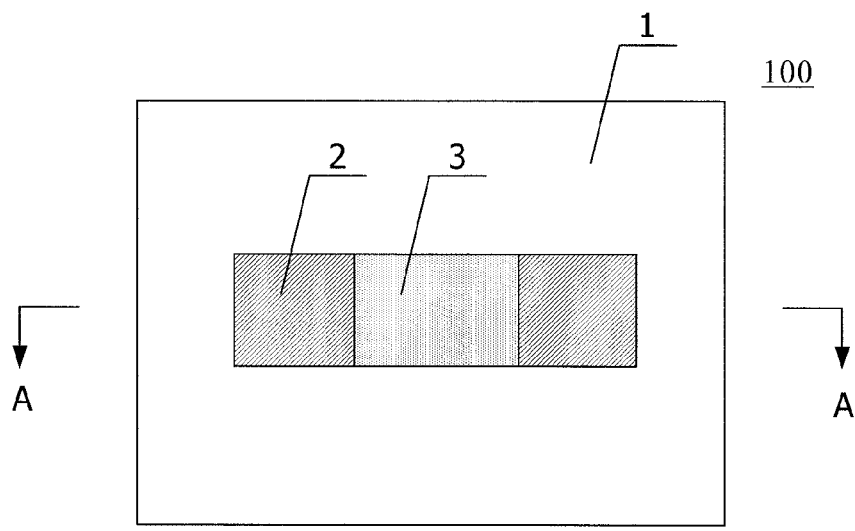
FIG. 1 is a planar schematic view of a mask plate according to a first embodiment of the invention.
Figure 2:
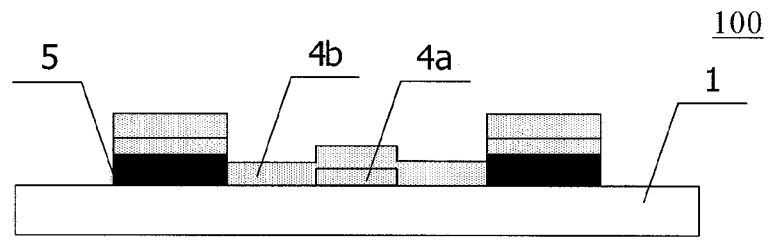
FIG. 2 is a cross-sectional view take along a line A-A in FIG. 1.

FIG. 1 is a planar schematic view of a mask plate according to a first embodiment of the invention, and FIG. 2 is a cross-sectional view taken along a line A-A in FIG. 2. As shown in FIGS. 1 and 2, the mask plate 100 comprises a substrate 1 with a non-transparent region 2 and a semi-transparent region 3 formed thereon. The region other than the non-transparent region 2 and the semi-transparent region 3 on the substrate is a transparent region. A semi-transparent film 4 (4a, 4b) is provided in the semi-transparent region 3, and the semi-transparent film 4 makes the light transmitted through the semi-transparent region 3 uniform. The thickness of the semi-transparent film 4 in the middle portion of the semi-transparent region 3 is larger than that of the semi-transparent film in the portion other than the middle portion of the semi-transparent region 3, that is, the portion adjacent to the both sides of the semi-transparent region 3 in FIG. 2. The non-transparent region 2 is formed with a metal layer 5 and the semi-transparent film 4. The semi-transparent film 4 comprises a first semi-transparent film 4a and a second semi-transparent film 4b on the first semi-transparent film 4a. The first semi-transparent film 4a is formed in the middle portion of the semi-transparent region 3. The material of the metal layer 5 may be a metal of chromium, molybdenum, manganese, or the alloy thereof, or other non-transparent solid metal materials. In the embodiment, the material of the metal layer 5 is a metal of chromium. The thickness of the metal layer 5 is about 1000 .ANG. to about 30000 .ANG.. For the mask plate 100 as shown in FIG. 2, the materials of the semi-transparent film 4a and the second semi-transparent film 4b are the same, and both of them are $Cr_2O_3$. The materials of the semi-transparent film 4a and the second semi-transparent film 4b may also be anyone selected from the group consisting of oxides of molybdenum and manganese, nitrides of chromium, molybdenum, and manganese, organic glass, transparent thermosetting polymer material, methylpentene polymer, M-COC transparent material, and other high-temperature and corrosion resistance materials. The thickness of the first semi-transparent film 4a is about 200 .ANG. to about 20000 .ANG., and the thickness of the second semi-transparent film 4b is about 200 .ANG. to about 5000 .ANG..

Figure 3:
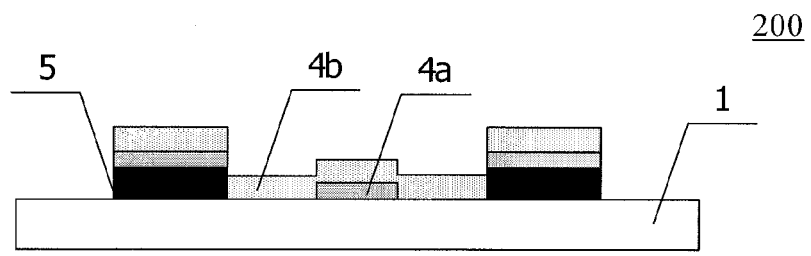
FIG. 3 is a structural schematic view of a mask plate according to a second embodiment of the invention.

FIG. 3 is a structural schematic view of a mask plate according to a second embodiment of the invention. As shown in FIG. 3, the planar structure of the mask plate 200 of the present embodiment is the same as that of the first embodiment (as shown in FIG. 1), and the difference of the mask plate in the second embodiment from that in the first amendment lies in the materials of the first and second semi-transparent films 4a and 4b are different from each other.

Figure 4:
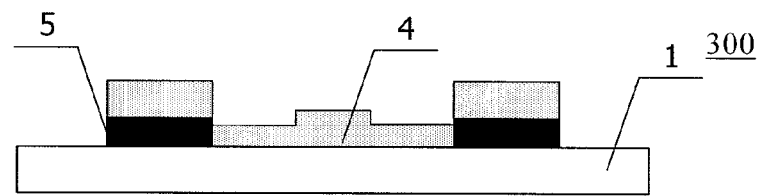
FIG. 4 is a structural schematic view of a mask plate according to a third embodiment of the invention.

FIG. 4 is a structural schematic view of a mask plate according to a third embodiment of the invention. As shown in FIG. 4, the mask plate 300 comprises a substrate 1 with a non-transparent region and a semi-transparent region formed thereon. The region other than the non-transparent region and the semi-transparent region on the substrate 1 is a transparent region. The semi-transparent region is formed with a semi-transparent film 4, which makes the light transmitted through the semi-transparent region uniform. The thickness of the semi-transparent film 4 in a middle portion of the semi-transparent region is larger than that of the semi-transparent film 4 in the portion other than the middle portion in the semi-transparent region. A metal layer 5 and the semi-transparent film 4 are stacked in the non-transparent region. The material of the metal layer 5 may be a metal of chromium, molybdenum, manganese, or the alloy thereof, or other non-transparent solid metal materials. In the embodiment, the material of the metal layer 5 is a metal of chromium. The thickness of the metal layer 5 is about 1000 .ANG. to about 30000 .ANG.. The material of the semi-transparent film 4 is $Cr_2O_3$. . The material of the semi-transparent film 4 may also be anyone selected from the group consisting of oxides of molybdenum and manganese, nitrides of chromium, molybdenum, and manganese, organic glass, transparent thermosetting polymer material, TPX, M-COC transparent material, and other high-temperature and corrosion resistance materials.

The thickness of the semi-transparent film 4 in the middle portion of the semi-transparent region is about 500 .ANG. to about 25000 .ANG..

Figure 5:
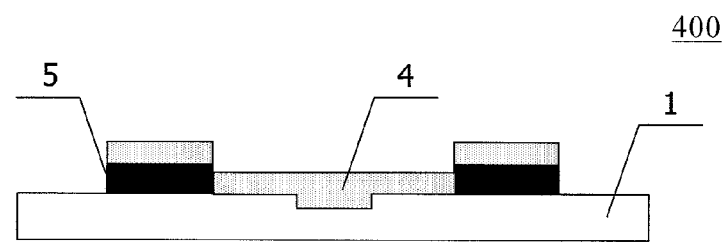
FIG. 5 is a structural schematic view of a mask plate according to a fourth embodiment of the invention.

FIG. 5 is a structural schematic view of a mask plate according to a fourth embodiment of the invention. As shown in FIG. 5, the mask plate 400 comprises a substrate 1 with a non-transparent region and a semi-transparent region formed thereon. The region other than the non-transparent region and the semi-transparent region on the substrate 1 is a transparent region The semi-transparent region is provided with a semi-transparent film 4, which makes the light transmitted through the semi-transparent region uniform. The substrate 1 is formed with a groove in a middle portion in the semi-transparent region so that the thickness of the semi-transparent film 4 at the groove position is larger than that of the semi-transparent film 4 at the position excluding the groove. A metal layer 5 and the semi-transparent film 4 are formed in stack in the non-transparent film. The material of the metal layer S may be a metal of chromium, molybdenum, manganese, or the alloy thereof, or other non-transparent solid metal materials. In the embodiment, the material of the metal layer 5 is a metal of chromium. The thickness of the metal layer 5 is about 1000 .ANG. to about 30000 .ANG.. The material of the semi-transparent 4 is $Cr_2O_3$. The material of the semi-transparent film 4 may also be anyone selected from the group consisting of oxides of molybdenum and manganese, nitrides of chromium, molybdenum, and manganese, organic glass, transparent thermosetting polymer material, TPX, M-COC transparent material, and other high-temperature and corrosion resistance materials. The thickness of the semi-transparent film 4 in the middle portion is about 500 .ANG. to about 25000.ANG..

Figure 6:
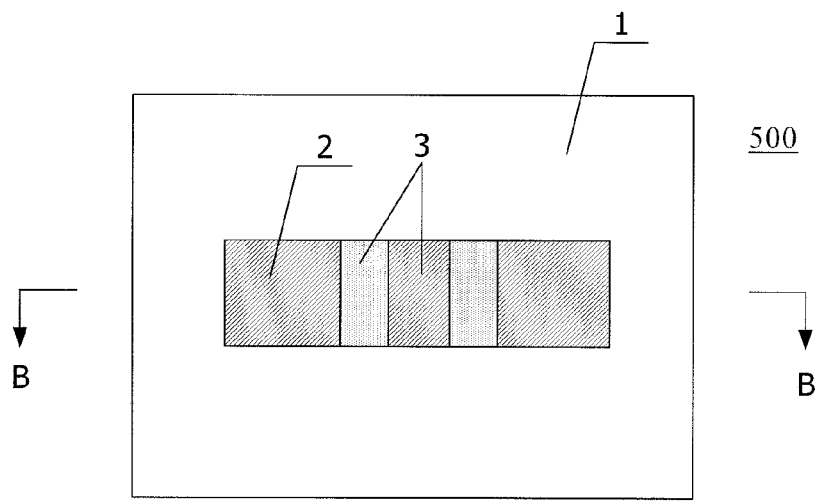
FIG. 6 is a structural schematic view of a mask plate according to a fifth embodiment of the invention.
Figure 7:
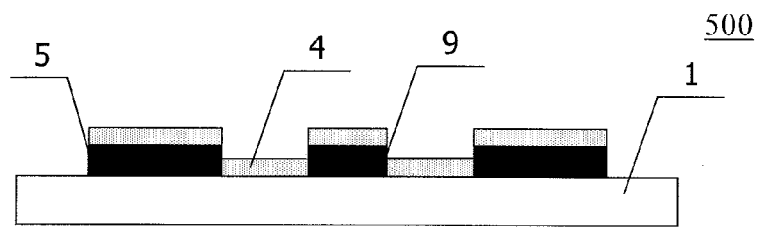
FIG. 7 is a cross-sectional view taken along a line B-B in FIG. 6.

FIG. 6 is a planar schematic view of a mask plate according to a fifth embodiment of the invention, and FIG. 7 is a cross-sectional view taken along a line B-B in FIG. 6. As shown in FIGS. 6 and 7, the mask plate 500 comprises a substrate 1 with a non-transparent region 2 and a semi-transparent region 3 formed thereon. The region other than the non-transparent region 2 and the semi-transparent region 3 on the substrate 1 is a transparent region. The semi-transparent region 3 is provided with a semi-transparent film 4 and a metal strip 9, which in combination make the light transmitted through the semi-transparent region 3 uniform, and the metal stripe 9 in the semi-transparent region 3 is formed within the semi-transparent film 4. A metal layer 5 and the semi-transparent film 4 are formed in stack in the non-transparent region 2. The material of the metal layer 5 may be a metal of chromium, molybdenum, manganese, or the alloy thereof, or other non-transparent solid metal materials. In the embodiment, the material of the metal layer 5 is a metal of chromium. The thickness of the metal layer 5 is about 1000 .ANG. to about 30000 .ANG.. Both the materials and the thickness of the metal strip 9 are the same as those of the metal layer 5. The material of the semi-transparent 4 is $Cr_2O_3$. . The material of the semi-transparent film 4 may also be anyone selected from the group consisting of oxides of molybdenum and manganese, nitrides of chromium, molybdenum, and manganese, organic glass, transparent thermosetting polymer material, TPX, M-COC transparent material, and other high-temperature and corrosion resistance materials. The thickness of the semi-transparent film 4 is about 200 .ANG. to about 20000 .ANG..

In the mask plate 500 of the fifth embodiment, there may be a plurality of metal strips in the semi-transparent region, and these metal strips are formed within the semi-transparent film, as long as the light transmitted through the semi-transparent region is rendered uniform.

Figure 8:
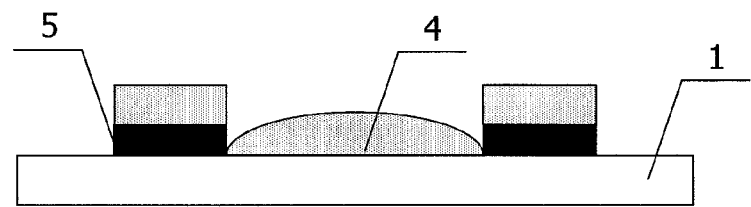
FIG. 8 is a schematic cross-sectional view of a mask plate according to an embodiment of the invention.

In the schematic views of the mask plates according to the first to the fourth embodiments mentioned above, the cross-sectional shape of the middle portion may also be arc, triangle, trapezoid or other shapes which can satisfy the relationship that the thickness of the semi-transparent film in the middle portion is larger than that of the semi-transparent film-in the portion other than the middle portion. For example, FIG. 8 shows a cross-sectional view of a mask plate according to an embodiment of the invention. As shown in FIG. 8, the mask plate comprises a substrate 1 with a non-transparent region and a semi-transparent region formed thereon. The region other than the non-transparent region and the semi-transparent region on the substrate 1 is a transparent region. The semi-transparent region is formed with a semi-transparent film 4 which makes the light transmitted through the semi-transparent region uniform. The thickness of the semi-transparent film 4 in a middle portion is larger than that of the semi-transparent film 4 in the portion other than the middle portion in the semi-transparent region, and the cross sectional shape of the semi-transparent film 4 in the semi-transparent region is an arc. A metal layer S and the semi-transparent film 4 are formed in the non-transparent region.

In addition, in the structure of the mask plates according to the first to the fifth embodiment mentioned above, the semi-transparent film 4 may not be provided on the metal layer 5, or the semi-transparent film 4 may be provided under the metal layer 5. The above variations in the structure will not influence the effect of the mask plates of the embodiments and are within the protection scope of the invention.

Figure 9:
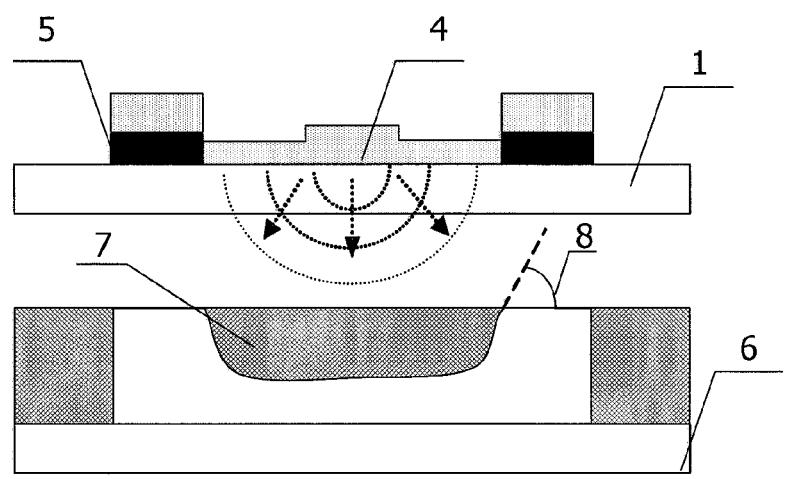
FIG. 9 is a schematic view showing a mechanism for exposure of photoresist using the mask plate.

FIG. 9 is one schematic view for explaining the operation mechanism of the mask plate according to the embodiment of the invention. As shown in FIG. 9, the thickness of the semi-transparent film in the middle portion is larger than that of the semi-transparent film in the portion other than the middle portion in the semi-transparent region, and the incident light is transmitted through the semi-transparent film on the mask plate so as to expose the photoresist layer applied on the object substrate 6 placed under the mask plate. Although the intensity of light reaching the middle portion of the mask plate is larger than that in the portion other than the middle portion, the intensity of the light transmitted through the middle portion of the semi-transparent region is more weakened due to the relatively larger thickness of the semi-transparent film in that portion, but the intensity of the light transmitted through the portion other than the middle portion of the semi-transparent region is less weaken due to the relatively small thickness of the semi-transparent film there, which leads to a relatively uniform intensity of the light transmitted trough the semi-transparent region. Therefore, the exposure extent of the photoresist layer on the object substrate corresponding to the semi-transparent region is rendered relatively uniform, i.e., the bottom of the exposed photoresist 7 on the object substrate corresponding to the semi-transparent region is relatively planar, so that the tilt angle 8 of the photoresist 7 is increased.

FIG. 9 showing the operation mechanism explained by taking the mask plate in the third embodiment as an example, but the operation mechanism can also be applied to the mask plate in the first, second and fourth embodiments and in FIG. 8, and is not repeated in detail for simplicity.

Figure 10:
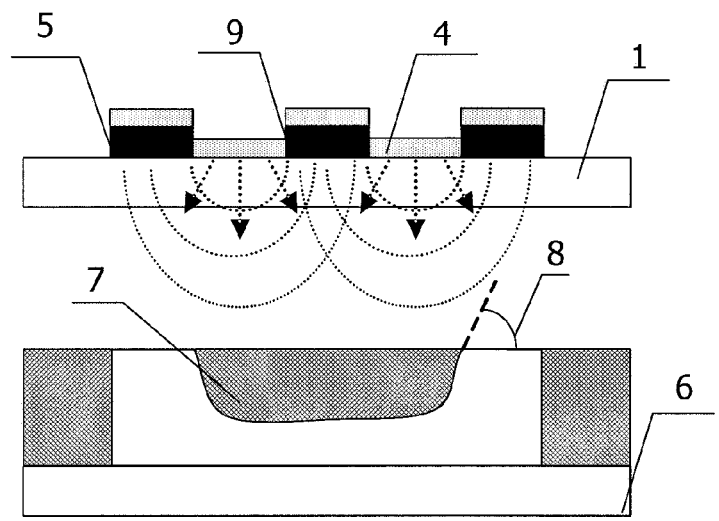
FIG. 10 is a schematic view showing another mechanism for exposure of photoresist using the mask plate.

FIG. 10 is a schematic view for explaining another operation mechanism of the mask plate according to an embodiment of the invention. As shown in FIG. 10, two-slit interference is occurred when the photoresist layer on the object substrate 6 is exposed with the mask plate. Since the metal strip 9 and the semi-transparent film 4 are formed in the semi-transparent region of the mask plate, and the metal strip 9 is formed within the semi-transparent film 4, the light transmissivity in the semi-transparent region of the mask plate is low. Therefore, the exposure speed of the photoresist layer is reduced when the exposure is actually performed. Accordingly, the intensity of the light transmitted though the semi-transparent region become uniform, and the exposure extent of the photoresist layer on the object substrate 6 corresponding to the semi-transparent region is relatively uniform, i.e., the exposed photoresist 7 on the object substrate 6 corresponding to the semi-transparent will be relatively planar. Therefore, the unevenness of the exposed photoresist layer can be avoided and the possibility of generating the GT bridge and the channel open can be decreased. The above mechanism is applied to the mask plate in the fifth embodiment.

A method of manufacturing the mask plate according to the first embodiment of the invention comprises the following steps.

Step 101 of depositing a metal layer on a substrate, removing the metal layer in a first region as a semi-transparent region and the metal layer in a second region as a transparent region with an etching process and thus forming a non-transparent region in other region covered by the metal layer.

Step 102 of forming a semi-transparent film on the substrate after step 101, so that the first region is formed into the semi-transparent region, and the thickness of the semi-transparent film in a middle portion is larger than that of the semi-transparent film in the portion other than the middle portion in the semi-transparent region.

Step 103 of removing the semi-transparent film in the second region so that the second region is formed into the transparent region.

A method of manufacturing a mask plate according to the second embodiment of the invention comprises the following steps. In the present embodiment, the substrate is a silica substrate, and the metal layer is a chromium metal layer.

Step 201 of depositing a metal layer on a substrate.

Step 202 of removing the metal layer in a first region as a semi-transparent region and a second region as a transparent region and thus forming a non-transparent region in other region covered by the metal layer.

Step 203 of depositing a layer of semi-transparent film on the substrate so as to cover the entire substrate.

Step 204 of removing the semi-transparent film at a portion other than a middle portion in the semi-transparent region.

Step 205 of depositing a second semi-transparent film to cover the entire substrate, so that the semi-transparent region is formed in the first region, and the thickness of the semi-transparent film in the middle portion is larger than that of the semi-transparent film in the portion other than the middle portion in the semi-transparent region.

Step 206 of removing the first semi-transparent film and the second semi-transparent film in the second region by a laser etching process,. so that the second region is formed into a transparent region.

Figure 11A:
FIGS. 11a-11f are schematic views of a method of manufacturing a mask plate according to the second embodiment of the invention.
Figure 11B:
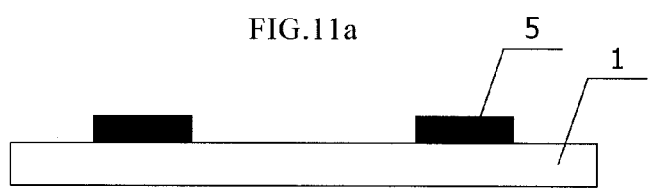
Figure 11C:
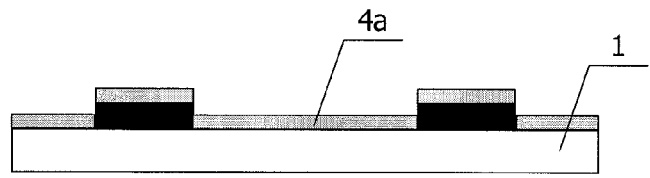
Figure 11D:
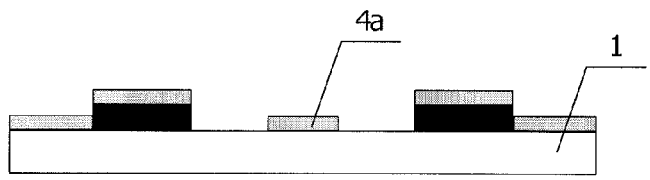
Figure 11E:
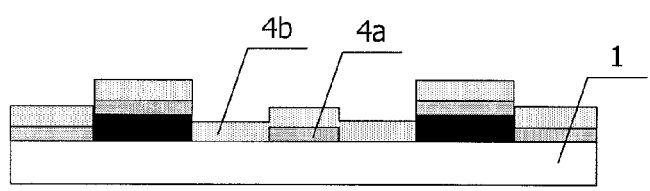
Figure 11F:
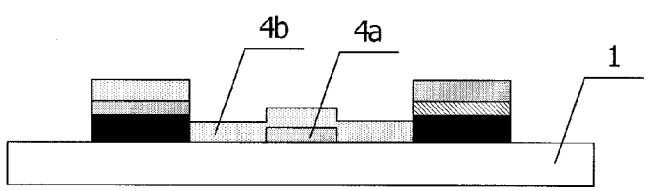

FIGS. 11a-11f are schematic views showing the method of manufacturing the mask plate according to the second embodiment of the invention. FIG. 11a is a schematic view showing that a metal layer 5 is formed on a substrate 1 in the method according to the second embodiment. As shown in FIG. 11a, the metal layer 5 in the embodiment is chromium, and the substrate 1 is a silica substrate. FIG. 11b is a schematic view showing that the metal layer 5 is etched in the method according to the second embodiment. As shown in FIG. 11b, the metal layer 5 in the first region as the semi-transparent region and in the second region as the transparent region is removed with a laser, and accordingly the non-transparent region is formed in other region covered by the metal layer 5. FIG. 11c is a schematic view showing the formation of the first semi-transparent film 4a in the manufacturing method according to the second embodiment. As shown in FIG. 11c, the semi-transparent film 4a is for example deposited on the substrate 1 to cover the entire substrate 1. FIG. 11d is a schematic view showing the etching of the semi-transparent film in the manufacturing method according to the second embodiment. As shown in FIG. 11d, the semi-transparent film 4a in the portion other than the middle portion in the first region is removed for example with a laser. FIG. 11e is a schematic view showing the formation of the second semitransparent film in the manufacturing method according to the second embodiment. As shown in FIG. 11e, the second semi-transparent film 4b is for example deposited on the substrate 1 to cover the entire substrate 1, so that the first region is formed into the semi-transparent region, and the thickness of the semi-transparent film in the middle portion is larger than that of the semi-transparent film in the portion other than the middle portion in the semi-transparent region. FIG. 11f is a schematic view showing the etching of the first and second semi-transparent films in the manufacturing method according to the second embodiment. As shown in FIG. 11f, the first and second semi-transparent films 4a and 4b in the second region are removed with a laser so that the second region is formed into a transparent region.

In the above manufacturing method according to the second embodiment, the thickness of the first semi-transparent film 4a is about 200 .ANG. to about 20000 .ANG., and the thickness of the second semi-transparent film 4b is about 200 .ANG. to about 5000.ANG.. The materials of the first and second semi-transparent films may be anyone selected from the group consisting of oxide of chromium, molybdenum, and manganese, nitride of chromium, molybdnum, and manganese, organic glass, transparent thermosetting polymer material, methylpentene polymer, and M-COC transparent material. The materials of the first and second semi-transparent films may be the same or different from each other. In addition, a solid laser or a gas laser can be used to remove the metal layer and the semi-transparent films.

A method of manufacturing a mask plate according to the third embodiment of the invention comprises the following steps. In the present embodiment, the substrate is a silica substrate, and the metal layer is a chromium layer.

Step 301 of depositing a metal layer on a substrate.

Step 302 of removing the metal layer in a first region as a semi-transparent region and in a second region as a transparent region and thus forming a non-transparent region in other region covered by the metal layer.

Step 303 of depositing a layer of semi-transparent film on the substrate so as to cover the entire substrate.

Step 304 of etching the semi-transparent film at a portion other than a middle portion in the first region with a laser, so that the first region is formed into the semi-transparent region, and the thickness of the semi-transparent film in the middle portion is larger than that of the semi-transparent film in the portion other than the middle portion in the semi-transparent region. In the present embodiment, a femtosecond laser pulse may be used to etch the semi-transparent film in the portion other than the middle portion in the first region.

Step 305 of removing the semi-transparent film in the second region with a laser, so that the second region is formed into the transparent region.

Figure 12A:
FIG. 12a-12e are schematic views of a method of manufacturing a mask plate according to the third embodiment of the invention.
Figure 12B:
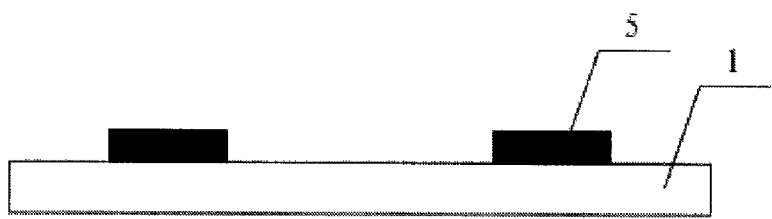
Figure 12C:
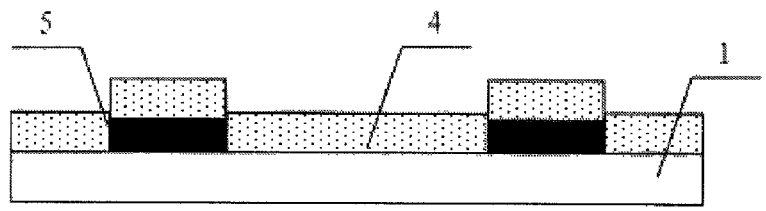
Figure 12D:
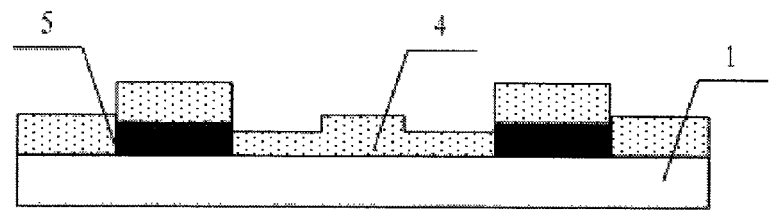
Figure 12E:
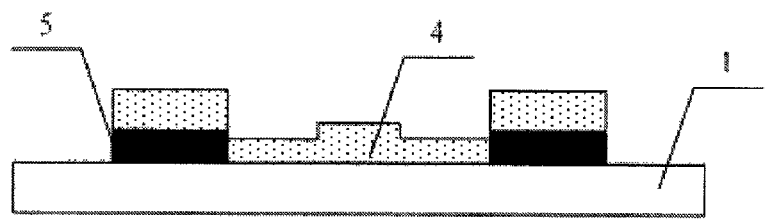

FIGS. 12a-12e are schematic views showing the method of manufacturing the mask plate according to the third embodiment of the invention. FIG. 12a is a schematic view showing the formation of the metal layer in the manufacturing method according to the third embodiment. As shown in FIG. 12a, the metal layer 5 in the embodiment is a chromium metal layer, and the substrate 1 is a silica substrate, and a metal layer 5 is deposited uniformly on the substrate 1. FIG. 12b is a schematic view showing the etching of the metal layer in the manufacturing method according to the third embodiment. As shown in FIG. 12b, the metal layer 5 in a first region as a semi-transparent region and in a second region as a transparent region is etched with laser, and thus a non-transparent region is formed in the region covered by the metal layer 5. FIG. 12c is a schematic view showing the formation of a semi-transparent film in the manufacturing method according to the third embodiment. As shown in FIG. 12c, a semi-transparent film 4 is deposited to cover the entire substrate 1. FIG. 12d is a schematic view showing the etching of semi-transparent film in the semi-transparent region in the manufacturing method according to the third embodiment. As shown in FIG. 12d, the semi-transparent film 4 in the portion other than the middle portion in the first region is etched by a laser etching process, so that the first region is formed into the semi-transparent region, and the thickness of the semi-transparent film 4 in a middle portion in the semi-transparent region is larger than that of the semi-transparent film 4 in the portion other than the middle portion. FIG. 12e is a schematic view showing the etching of the semi-transparent film in the manufacturing method according to the third embodiment. As shown in FIG. 12e, the semi-transparent film 4 in the second region is removed by a laser etching process so that the second region is formed into the transparent region.

In the above manufacturing method according to the third embodiment, a solid laser or a gas laser may be used to etch the metal layer and the semi-transparent film in the transparent region, and a femtosecond laser pulse may be used to etch the semi-transparent film in the semi-transparent region, i.e., by a laser micro-etching. In addition, the material of the semi-transparent film 4 may be anyone selected from the group consisting of oxide of chromium, molybdenum, and manganese, nitride of chromium, molybdnum, and manganese, organic glass, transparent thermosetting polymer material, methylpentene polymer, and M-COC transparent material. The thickness of the semi-transparent film in the middle portion is about 500.ANG. to about 25000 .ANG..

A method of manufacturing a mask plate according to the fourth embodiment comprises the following steps. In the present embodiment, the substrate is a silica substrate and the metal layer is a chromium metal layer.

Step 401 of depositing a metal layer on a substrate.

Step 402 of removing the metal layer in a first region as a semi-transparent region and a second region as a transparent region and thus forming a non-transparent region in other region covered by the metal layer.

Step 403 of etching the substrate in the middle portion in the first region by a laser so as to form a groove area. In the present embodiment, a femtosecond laser may be used to etch the substrate in the middle portion.

Step 404 of forming a semi-transparent film on the substrate to cover the entire substrate, so that the first region is formed into the semi-transparent region and the thickness of the semi-transparent film in the groove area is larger than that of the semi-transparent film in the area excluding the groove in the semi-transparent region.

Step 405 of removing the semi-transparent film in the second region by a laser so that the second region is formed into the transparent region.

Figure 13A:
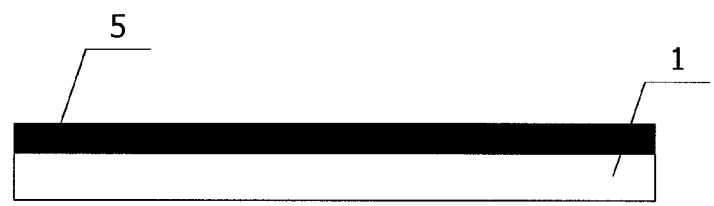
FIG. 13a-13e are schematic views of a method of manufacturing a mask plate according to the fourth embodiment of the invention.
Figure 13B:
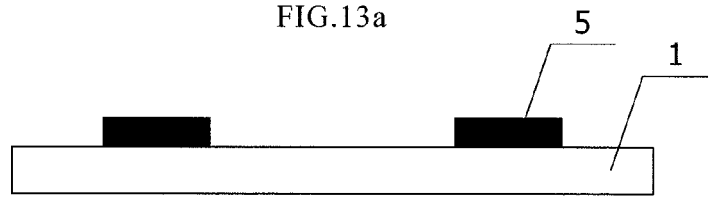
Figure 13C:
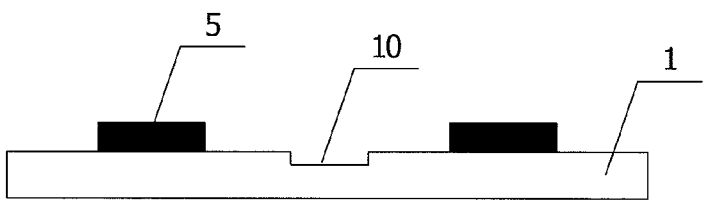
Figure 13D:
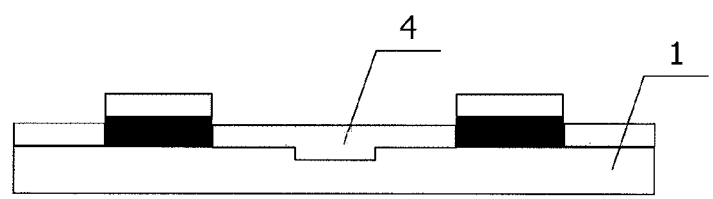
Figure 13E:
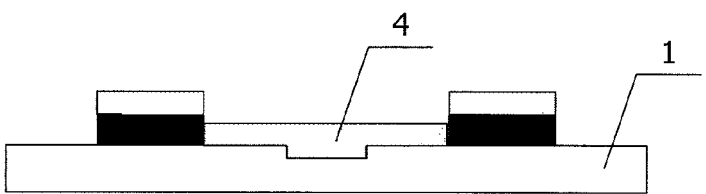

FIGS. 13a-13e are schematic views showing the method of manufacturing the mask plate according to the fourth embodiment of the invention. FIG. 13a is a schematic view showing the formation of the metal layer 5 in the manufacturing method according to the fourth embodiment. As shown in FIG. 13a, the metal layer 5 in the embodiment is a chromium metal layer, and the substrate 1 is a silica substrate, and the metal layer 5 is deposited uniformly on the substrate 1. FIG. 13b is a schematic view showing the etching of the metal layer in the manufacturing method according to the fourth embodiment. As shown in FIG. 13b, the metal layer 5 in a first region as a semi-transparent region and in a second region as a transparent region is removed for example with a laser, and thus a non-transparent region is formed in other region covered by the metal layer 5. FIG. 13c is a schematic view showing the etching of the substrate in the manufacturing method according to the fourth embodiment. As shown in FIG. 13c, the substrate 1 is etched in the middle portion in the first region for example with a laser so as to form a groove area 10. In the embodiment, a femtosecond laser pulse may be used to etch the substrate 1 in the middle portion. FIG. 13d is a schematic view showing the formation of the semi-transparent film in the manufacturing method according to the fourth embodiment. As shown in FIG. 13d, a semi-transparent film 4 is formed to cover the entire substrate 1, so that the first region is formed into the semi-transparent region and the thickness of the semi-transparent film 4 in the groove area 10 is larger than that of the semi-transparent film 4 in the area other than the groove area 10 in the semi-transparent region. FIG. 13e is a schematic view showing the etching of the semi-transparent film in the manufacturing method according to the fourth embodiment. As shown in FIG. 13e, the semi-transparent film 4 in the second region is removed by a laser etching process so that the second region is formed into the transparent region.

In the above fourth embodiment of the manufacturing method, a solid laser or a gas laser may be used to etch the metal layer 5 and the semi-transparent film 4 in the transparent region, and a femtosecond laser pulse may be used to etch the substrate 1, i.e., by a laser micro-etching. In addition, the material of the semi-transparent film 4 may be anyone selected from the group consisting of oxide of chromium, molybdenum, and manganese, nitride of chromium, molybdenum, and manganese, organic glass, transparent thermosetting polymer material, methylpentene polymer, and M-COC transparent material. The thickness of the semi-transparent film at the groove is about 500 .ANG.to about 25000 .ANG..

A method of manufacturing a mask plate according to the fifth embodiment of the invention comprises the following steps. In the present embodiment, the substrate may be a silica substrate, and the metal layer may be a chromium layer.

Step 501 of depositing a metal layer on a substrate.

Step 502 of removing the metal layer in a first region as a semi-transparent region and a second region as a transparent region, and thus forming a non-transparent region in other region covered by the metal layer and forming a metal strip in the first region.

Step 503 of depositing a semi-transparent film on the substrate to cover the entire substrate so that the first region is formed into the semi-transparent region.

Step 504 of removing the semi-transparent film in the second region by a laser so that the second region is formed into the transparent region.

Figure 14A:
FIGS. 14a-14d are schematic views of a method of manufacturing a mask plate according to the fifth embodiment of the invention.

FIGS. 14a-14d are schematic views showing the method of manufacturing the mask plate according to the fifth embodiment of the invention. FIG. 14a is a schematic view showing the formation of the metal layer 5 on the substrate 1 in the manufacturing method according to the fifth embodiment. As shown in FIG. 14a, the metal layer 5 in the embodiment is a chromium layer, the substrate 1 is a silica substrate, and the metal layer 5 is deposited on the substrate 1 uniformly. FIG.

Figure 14B:
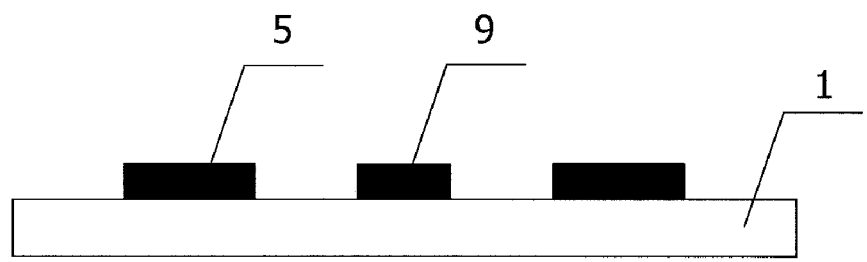
Figure 14C:
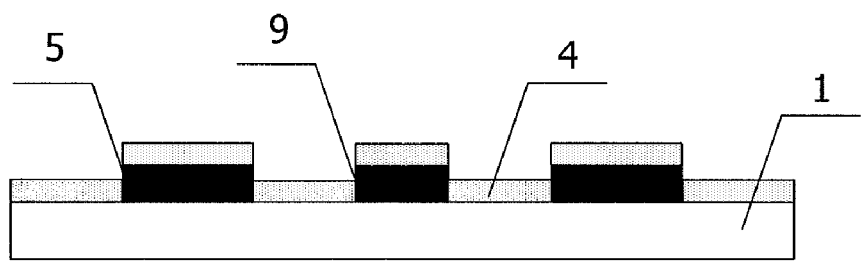
Figure 14D:
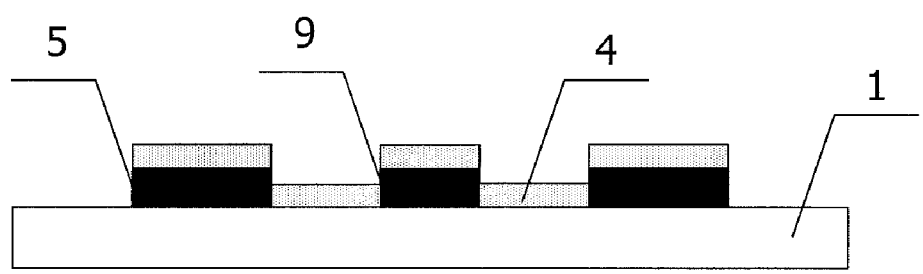

14*b* is a schematic view showing the etching of the metal layer 5 in the manufacturing method according to the fifth embodiment. As shown in FIG. 14*b*, the metal layer 5 in the first region as the semi-transparent region and in the second region as the transparent region is removed by a laser etching process, and other region covered by the metal layer 5 is formed into the non-transparent region. In addition, a metal strip 9 is formed in the first region. FIG. 14*c* is a schematic view showing the formation of the semi-transparent film 4 in the manufacturing method according to the fifth embodiment. As shown in FIG. 14*c*, a semi-transparent film 4 is deposited on the substrate 1 to cover the entire substrate 1 so that the first region is formed into the semi-transparent region. FIG. 14*d* is a schematic view showing the etching of the semi-transparent film in the manufacturing method according to the fifth embodiment. As shown in FIG. 14*d*, the semi-transparent film 4 in the second region is removed for example by a laser etching process so that the second region is formed into the transparent region.

In the above fifth embodiment of the manufacturing method, a solid laser or a gas laser may be used to etch the metal layer and the semi-transparent film in the transparent region. In addition, the material of the semi-transparent film may be anyone selected from the group consisting of oxide of chromium, molybdenum, and manganese, nitride of chromium, molybdenum, and manganese, organic glass, transparent thermosetting polymer material, methylpentene polymer, and M-COC transparent material. The thickness of the semi-transparent film is about 200 .ANG. to about 20000 .ANG..

In the above manufacturing method according to the fifth embodiment, a plurality of metal strips may be formed in the semitransparent region with the same manufacturing method as above, and the details will be omitted here for simplicity.

The manufacturing methods of the mask plat according to the first to fifth embodiments of the invention may comprise a step for removing the semi-transparent film on the metal layer. In addition, the process of depositing the semi-transparent film on the substrate is performed in one or two times, but the formation of the semi-transparent film on the substrate may be performed by depositing the semi-transparent films with different materials in several times.

A method of manufacturing a mask plate according to a sixth embodiment of the invention comprises the following steps.

Step 601 pf forming a semi-transparent film on the substrate so that the thickness of the semi-transparent film in the middle portion is larger than that of the semi-transparent film in the portion other than the middle portion in a first region as a semi-transparent region.

Step 602 of depositing a metal layer on the substrate after step 601.

Step 603 of removing the metal layer in the first region and both the metal layer and the semi-transparent film in a second region as a transparent region, so that the first region is formed into the semi-transparent region, the second region is formed into the transparent region and the other region covered by the metal layer is formed into the non-transparent region.

The above method may be used to manufacture a mask plate in which the metal layer is formed on the semi-transparent film. The above manufacturing method will be described below in detail in combination with a specific example.

Figure 15A:
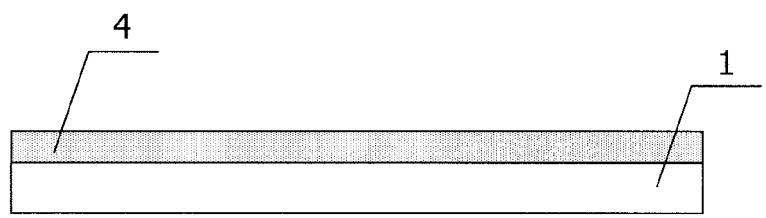
FIG. 15a-15d are schematic views of a method of manufacturing a mask plate according to a sixth embodiment of the invention.
Figure 15B:
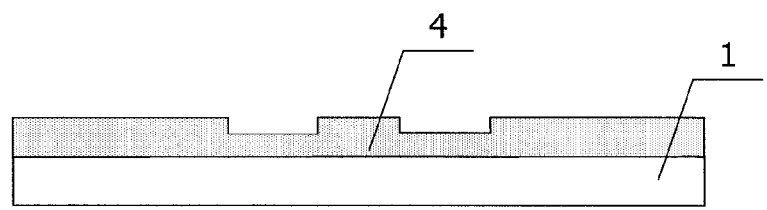
Figure 15C:
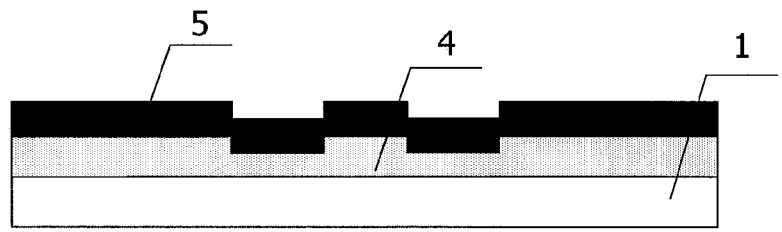
Figure 15D:
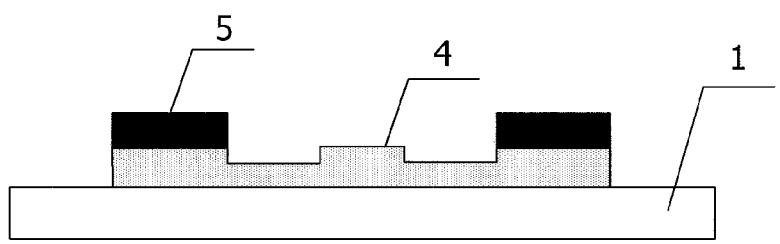

FIGS. 15*a*-15*d* are schematic views showing the method of manufacturing the mask plate according to the sixth embodiment of the invention. In the present embodiment, the substrate 1 is a silica substrate, and the metal layer 5 is a chromium metal layer. FIG. 15*a* is a schematic view showing the deposition of the semi-transparent film in the manufacturing method according to the sixth embodiment. As shown in FIG. 15*a*, a semi-transparent film 4 is deposited on the substrate 1. FIG. 15*b* is a schematic view showing the etching of the semi-transparent film in the manufacturing method according to the sixth embodiment. As shown in FIG. 15*b*, the semi-transparent film 4 in a first region as a semi-transparent region is etched for example by a laser, so that the thickness of the semi-transparent film 4 in the middle portion is larger than that of the semi-transparent film 4 in the portion other than the middle portion in the first region. FIG. 15*c* is a schematic view showing the deposition of the metal layer in the manufacturing method according to the sixth embodiment. As shown in FIG. 15*c*, a metal layer 5 is deposited on the substrate 1. FIG. 15*d* is a schematic view showing the etching of the metal layer in the manufacturing method according to the sixth embodiment. As shown in FIG. 15*d*, the metal layer 5 in the first region and both the metal layer 5 and the semi-transparent film 4 in the second region as the transparent region are removed by a laser etching process, so that the first region is formed into the semi-transparent region, the second region is formed into the transparent region and the other region covered by the remaining metal layer 5 is formed into the non-transparent region.

A method of manufacturing a mask plate according to a seventh embodiment of the invention comprises the following steps.

Step 701 of a semi-transparent film is deposited on a substrate.

Step 702 of a metal layer is deposited on the substrate after step 701.

Step 703 of removing the metal layer in a first region as a semi-transparent region and both the metal layer and the semi-transparent film in a second region as a transparent region, and forming at least a metal strip in the first region, so that the first region is formed into the semi-transparent region, the second region is formed into the transparent region and the other region is formed into the non-transparent region.

The above method may be used to manufacture a mask plate in which the metal layer is formed on the semi-transparent film. The above manufacturing method will be described below in detail in combination with a specific example.

Figure 16A:
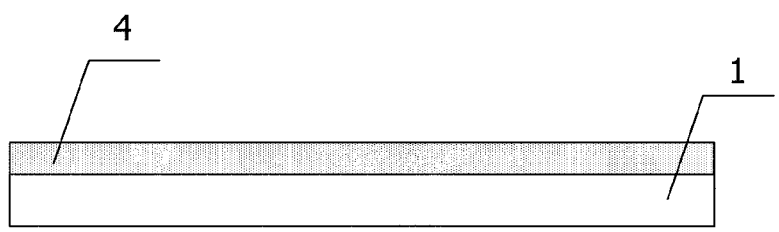
FIG. 16a-16c are schematic views of a method of manufacturing a mask plate according to a seventh embodiment of the invention.
Figure 16B:
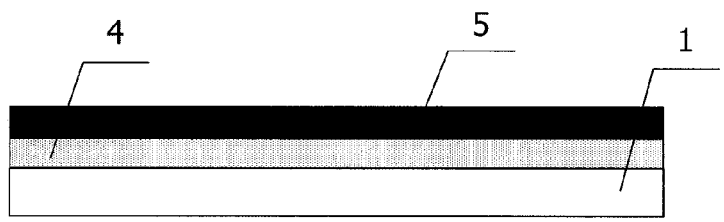
Figure 16C:
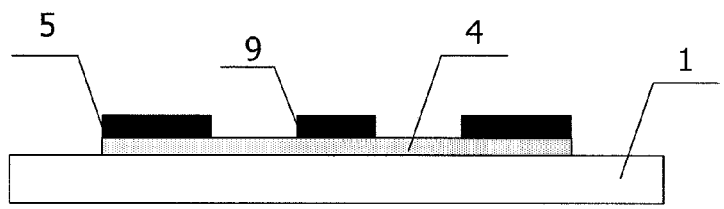

FIGS. 16*a*-16*c* are schematic views showing the method of manufacturing the mask plate according to the seventh embodiment of the invention. In the present embodiment, the substrate is a silica substrate, and the metal layer is a chromium metal layer. FIG. 16*a* is a schematic view showing the deposition of the semi-transparent film in the manufacturing method according to the seventh embodiment. As shown in FIG. 16*a*, a semi-transparent film 4 is deposited on a substrate 1. FIG. 16*b* is a schematic view showing the deposition of the metal layer in the manufacturing method according to the seventh embodiment. As shown in FIG. 16*b*, a metal layer 5 is deposited on the semi-transparent film 4 on the substrate 1. FIG. 16*c* is a schematic view showing the etching of the metal layer 5 and the semi-transparent film 4 in the manufacturing method according to the seventh embodiment. As shown in FIG. 16*c*, the metal layer 5 in a first region as a semi-transparent region and both the semi-transparent film 4 and the metal layer 5 in a second region as a transparent region are removed for example by a laser etching process, and also a metal strip 9 is formed in the first region, so that the first region is formed into the semi-transparent region, the second region is formed into the transparent region and the other region is formed into the non-transparent region.

In the manufacturing methods according to the sixth and seventh embodiments, in order to remove the metal layer 5 formed on the semi-transparent film 4 in the semi-transparent region accurately, the thickness of the semi-transparent film 4 is made with a certain margin, and the margin and the metal layer 5 will be removed together when the metal layer 5 on the semi-transparent film 4 is removed.

Figure 17:
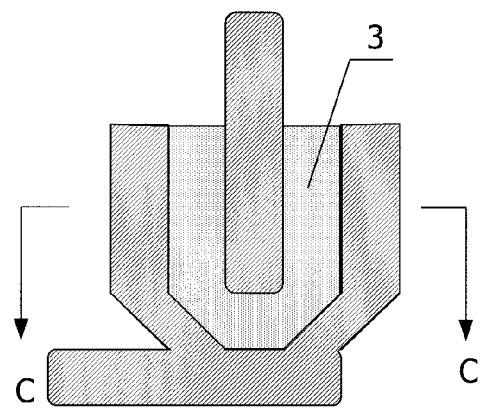
FIG. 17 is a schematic view of a semi-transparent region on a mask plate of the invention.
Figure 18:
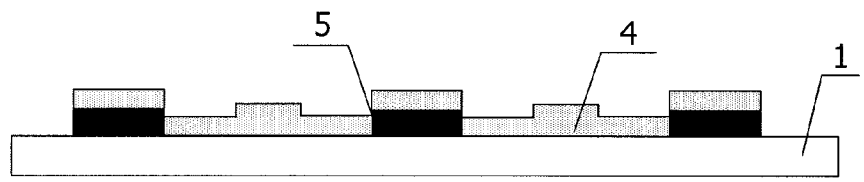
FIG. 18 is a cross-sectional view taken along a line C-C in FIG. 17.

The above mentioned mask plates can be used in exposing of the TFT channel region when forming a TFT. For example, FIG. 17 is a schematic view of the semi-transparent region on a mask plate according to an embodiment of the invention, and FIG. 18 is a cross-sectional view taken along a line C-C in FIG. 17. As shown in FIGS. 17 and 18, a semi-transparent film 4 which makes the light transmitted through the semi-transparent region 3 in a "U" shape uniformly is provided in the semi-transparent region 3, and the thickness of the semi-transparent film 4 in the middle portion is larger than that in the portion other than the middle portion in the semi-transparent region 3. The intensity of the light transmitted through the semi-transparent region 3 become uniform when the mask plate is used to expose a photoresist layer, so that the exposed photoresist layer in the channel region on the object substrate is relatively planar with increased tilt angle up to larger than 45°. However, in the conventional mask plate using the semi-transparent film with a uniform thickness, the tilt angle of the exposed photoresist layer in the channel region is only in the range of 40-45°. The increase in the tilt angle of the photoresist leads to the reduction of the length of the channel region formed in the subsequent etching process. Therefore, the charging characteristics are improved. In addition, the exposed photoresist layer in the channel region on the object substrate is relatively planar, and the planeness is increased substantially, so that the possibility of generating the GT bridge and the channel open is decreased.

Figure 19:
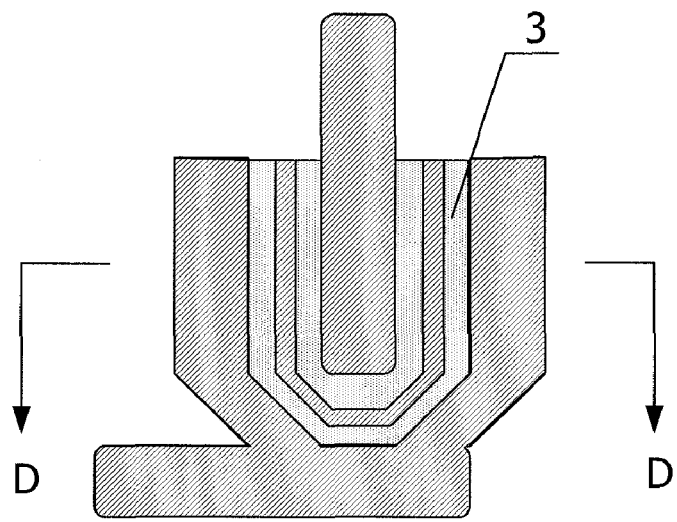
FIG. 19 is another schematic view of a semi-transparent region on a mask plate of the invention.
Figure 20:
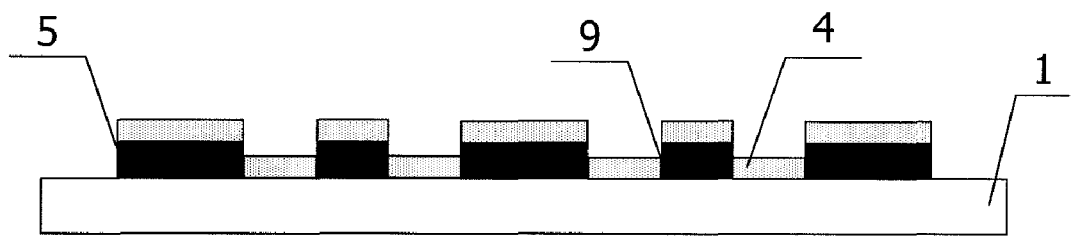
FIG. 20 is a cross-sectional view taken along a line D-D in FIG. 19.
Figure 21:
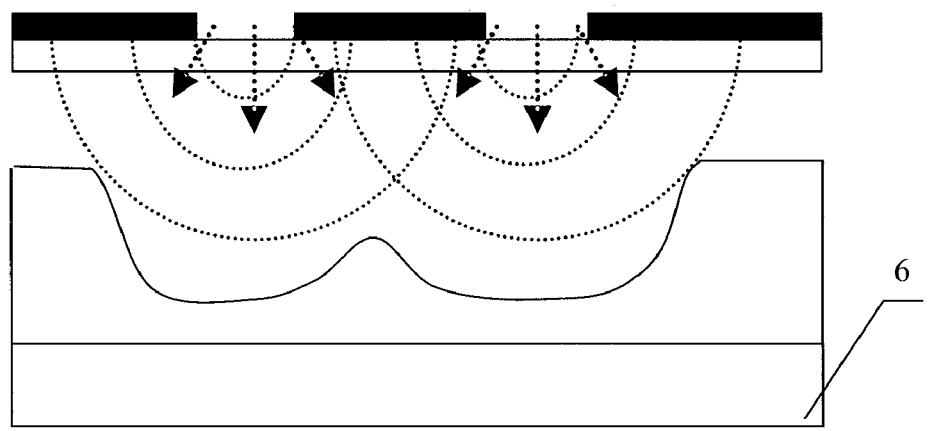
FIG. 21 is a schematic view showing the exposure of the photoresist in a channel region using a conventional grey tone mask.
Figure 22:
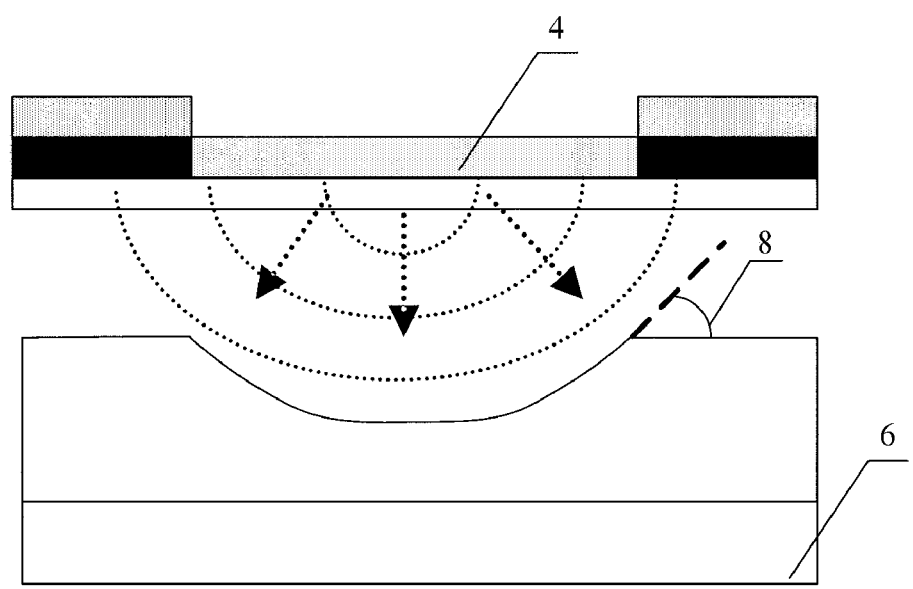
FIG. 22 is a schematic view showing the exposure of the photoresist in a channel region using a conventional half tone mask.

FIG. 19 is a schematic view of the semi-transparent region on a mask plate according to another embodiment of the invention, and FIG. 20 is a cross-sectional view taken along a line D-D in FIG. 19. As shown in FIGS. 19 and 20, the semi-transparent region 3 in a "U" shape is formed with a semi-transparent film 4 which makes the light transmitted through the semi-transparent region 3 uniformly. Unlike the structure of the semi-transparent region in FIG. 2, the semi-transparent region is formed with a metal strip 9 therein and a semi-transparent film 4, and the metal strip 9 is provided within the semi-transparent film 4. Two-slit interference occurs when the exposure of the channel region is performed using the mask plate. In exposing, the exposure speed is reduced so that the intensity of the light transmitted through the semi-transparent region 3 becomes uniform. The exposed photoresist layer in the channel region on the object substrate is relatively planar with an increased tilt angle, so that the length of the channel formed in the subsequent etching process is reduced and the charging characteristics are improved. In addition, the exposed photoresist layer in the channel region on the object substrate is relatively planar, and the planeness is increased substantially, so that the possibility of generating the GT bridge and the channel open is decreased.

According to the embodiments of the invention, a semi-transparent film with non-uniform thickness is used in the semi-transparent region of the mask plate, and the photoresist layer in the channel region can be exposed uniformly by using the mask plate. Therefore, the unevenness of the exposed photoresist in the conventional gray tone mask can be avoided, the planeness of the exposed photoresist can be improved, and the possibility of generating the GT bridge and the channel open is reduced. The embodiments of the invention also solves the problem that the tilt angle of the exposed photoresist at the channel is too small by increasing the tilt angle of the exposed photoresist, so that the length of the channel formed in the subsequent etching process is reduced and the charging characteristics of the TFT channel is improved.

In the embodiments, the etching method to remove the metal layer or the semi-transparent layer can be other suitable method other than that using a laser.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A half-tone mask plate comprising: a substrate formed with a transparent region, a non-transparent region and a semi-transparent region, which regions correspond to three pattern regions with different exposure extents in a photo-lithograph process, the exposure extent of the semi-transparent region being between that of the transparent region and that of the non-transparent region, wherein the semi-transparent region comprises a semi-transparent film, and a middle portion of the semi-transparent region is formed so that the intensity of the light transmitted therethrough is reduced in a larger extent than that in which the intensity of the light transmitted through the portion other than the middle portion in the semi-transparent region is reduced, whereby the light transmitted through the semi-transparent region is uniform.

2. The half-tone mask plate of claim 1, wherein the thickness of the semi-transparent film in the middle portion is larger than that of the semi-transparent film in the portion other than the middle portion in the semi-transparent region.

3. The half-tone mask plate of claim 2, wherein the thickness of the semi-transparent film in the middle portion is about 500 .ANG. to about 25000 .ANG..

4. The half-tone mask plate of claim 2, wherein the semi-transparent film at least comprises a first semi-transparent film and a second semi-transparent film on the first semi-transparent film, and the first semi-transparent film is located in the middle portion of the semi-transparent region.

5. The half-tone mask plate of claim 4, wherein the thickness of the first semi-transparent film is about 200 .ANG. to about 20000 .ANG., and the thickness of the second semi-transparent film is about 200 .ANG. to about 5000 .ANG..

6. The half-tone mask plate of claim 4, wherein the material of the first semi-transparent film is the same as that of the second semi-transparent film.

7. The half-tone mask plate of claim 2, wherein the material of the semi-transparent film is anyone selected from a group consisting of an oxide of chromium, molybdenum, and manganese, a nitride of chromium, molybdenum, and manganese, organic glass, transparent thermosetting polymer material, methylpentene polymer, and M-COC transparent material.

8. The half-tone mask plate of claim 2, wherein the substrate is provided with a groove area in the middle portion and the semi-transparent film is filled in the groove, so that the thickness of the semi-transparent film in the groove area is larger than that of the semi-transparent in the area other than the groove area.

9. The half-tone mask plate of claim 8, wherein the thickness of the semi-transparent film in the groove area is about 500 .ANG. to about 25000 .ANG..

10. The half-tone mask plate of claim 1, wherein the middle portion of the semi-transparent region is provided with a metal strip, and the metal strip is provided within the semi-transparent film.

11. The half-tone mask plate of claim 10, wherein the thickness of the semi-transparent film is about 200 .ANG. to about 20000 .ANG..

12. The half-tone mask plate of claim 10, wherein the material of the semi-transparent film is any one selected from a group consisting of an oxide of chromium, molybdenum, and manganese, a nitride of chromium, molybdenum, and manganese, organic glass, transparent thermosetting polymer material, methylpentene polymer, and M-COC transparent material.

13. A method for manufacturing a half-tone mask plate comprising: forming a transparent region, a non-transparent region, and a semi-transparent region on a substrate, which regions corresponds to three pattern region with different exposure extents in an photolithograph process, the exposure extent of the semi-transparent region being between that of the transparent region and that of the non-transparent region, wherein the non-transparent region is formed by patterning a metal layer formed on the substrate; and the semi-transparent region is formed by patterning a semi-transparent film formed on the substrate, and a middle portion of the semi-transparent region is formed so that the intensity of the light transmitted therethrough is reduced in a larger extent than that in which the intensity of the light transmitted through the portion other than the middle portion in the semi-transparent region is reduced, whereby the light transmitted through the semi-transparent region is uniform.

14. The method of claim 13, wherein forming the transparent region, the non-transparent region and the semi-transparent region on the substrate comprises: depositing the metal layer on the substrate, removing the metal layer in a first region as the semi-transparent region and in a second region as the transparent region and thus forming the non-transparent region in other region covered by the metal layer on the substrate; forming the semi-transparent film on the substrate so that the first region is formed into the semi-transparent region, wherein the thickness of the semi-transparent film in a middle portion is larger than that of the semi-transparent film in the portion other than the middle portion in the semi-transparent region; and removing the semi-transparent film in the second region so that the second region is formed into the transparent region.

15. The method of claim 14, wherein forming the semi-transparent film on the substrate so that the first region is formed into the semi-transparent region comprises: depositing a first semi-transparent film on the substrate; removing the first semi-transparent film at the portion other than the middle portion in the first region; and depositing a second semi-transparent film on the substrate to cover the first semi-transparent film.

16. The method of claim 15, wherein the thickness of the first semi-transparent film is about 200 .ANG. to about 20000 .ANG., and the second semi-transparent film is about 200 .ANG. to about 5000 .ANG..

17. The method of claim 14, wherein forming the semi-transparent film on the substrate so that the first region is formed into the semi-transparent region comprises: depositing the semi-transparent film on the substrate; and etching the semi-transparent film in the portion other than the middle portion in the first region, so that the thickness of the semi-transparent film in the middle portion is larger than that of the semi-transparent film in the portion other than the middle portion in the semi-transparent region.

18. The method of claim 17, wherein the thickness of the semi-transparent film in the middle portion in the semi-transparent region is about 500 .ANG. to about 25000 .ANG..

19. The method of claim 14, wherein forming the semi-transparent film on the substrate so that the first region is formed into the semi-transparent region comprises: forming a groove area by etching the substrate in the middle portion of the first region; and forming the semi-transparent film on the substrate, so that the thickness of the semi-transparent film in the groove area is larger than that of the semi-transparent film in the area other than the groove area in the semi-transparent region.

20. The method of claim 19, wherein the thickness of the semi-transparent film in the groove area in the semi-transparent region is about 500 .ANG. to about 25000 .ANG..

21. The method of claim 13, wherein forming the transparent region, the non-transparent region and the semi-transparent region on the substrate comprises: depositing the metal layer on the substrate, removing the metal layer in a first region as the semi-transparent region and in a second region as the transparent region, and thus forming the non-transparent region in other region covered by the metal layer on the substrate and forming at least a metal strip in the middle portion of the first region; forming the semi-transparent film on the substrate so that the first region is formed into the semi-transparent region; and removing the semi-transparent film in the second region so that the second region is formed into the transparent region.

22. The method of claim 21, wherein the thickness of the semi-transparent film is about 200 .ANG. to about 20000 .ANG..

23. The method of claim 13, wherein forming the transparent region, the non-transparent region and the semi-transparent region on the substrate comprises: forming the semi-transparent film on the substrate so that the thickness of the semi-transparent film in a middle portion is larger than that of the semi-transparent film in the portion other than the middle portion in a first region as the semi-transparent region; depositing the metal layer on the substrate; and removing the metal layer in the first region and removing both the metal layer and the semi-transparent film in a second region as the transparent region, so that the first region is formed into the semi-transparent region, the second region is formed into the transparent region, and the other region covered by the metal layer is formed into the non-transparent region.

24. The method of claim 13, wherein forming the transparent region, the non-transparent region and the semi-transparent region on the substrate comprises: depositing the semi-transparent film on the substrate; depositing the metal layer on the substrate; and removing the metal layer in a first region as the semi-transparent region and removing both the semi-transparent layer and the metal layer in a second region as the transparent region, forming at least a metal strip in a middle portion of the first region, so that the first region is formed into the semi-transparent region, the second region is formed into the transparent region, and the other region is formed into the non-transparent region.

* * * * *